(12) United States Patent
Nakaoka et al.

(10) Patent No.: US 10,978,316 B2
(45) Date of Patent: Apr. 13, 2021

(54) SEMICONDUCTOR PROCESSING DEVICE

(71) Applicant: TOSHIBA MEMORY CORPORATION, Minato-ku (JP)

(72) Inventors: Satoshi Nakaoka, Yokkaichi (JP); Tomohiko Sugita, Yokkaichi (JP); Shinsuke Kimura, Yokkaichi (JP); Hiroaki Ashidate, Mie (JP); Katsuhiro Sato, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 193 days.

(21) Appl. No.: 16/045,786

(22) Filed: Jul. 26, 2018

(65) Prior Publication Data

US 2019/0259639 A1   Aug. 22, 2019

(30) Foreign Application Priority Data

Feb. 21, 2018  (JP) .............................. JP2018-028997

(51) Int. Cl.

| *H01L 21/67* | (2006.01) |
| *H01L 21/673* | (2006.01) |
| *H01L 21/677* | (2006.01) |
| *B08B 3/10* | (2006.01) |
| *B08B 3/08* | (2006.01) |

(52) U.S. Cl.
CPC .. *H01L 21/67057* (2013.01); *H01L 21/67086* (2013.01); *H01L 21/67313* (2013.01); *H01L 21/67757* (2013.01); *B08B 3/08* (2013.01); *B08B 3/10* (2013.01); *B08B 3/102* (2013.01)

(58) Field of Classification Search
None
See application file for complete search history.

(56) References Cited

U.S. PATENT DOCUMENTS

| 5,921,257 A | 7/1999 | Weber et al. |
| 6,391,067 B2 | 5/2002 | Yanagita et al. |
| 8,652,344 B2 | 2/2014 | Tsurusaki et al. |
| 9,431,277 B2 | 8/2016 | Hinode et al. |
| 2004/0221880 A1 | 11/2004 | Tomita et al. |
| 2008/0073030 A1 | 3/2008 | Yoshino |

(Continued)

FOREIGN PATENT DOCUMENTS

| JP | 10-150013 | 6/1998 |
| JP | 10-229065 | 8/1998 |

(Continued)

*Primary Examiner* — Michael E Barr
*Assistant Examiner* — Jason P Riggleman
(74) *Attorney, Agent, or Firm* — Oblon, McClelland, Maier & Neustadt, L.L.P.

(57) ABSTRACT

A semiconductor processing device according to an embodiment includes a processing tank configured to store a chemical therein to allow a semiconductor substrate to be immersed in the chemical. A gas supply part is provided below the semiconductor substrate accommodated in the processing tank and is configured to supply air bubbles to the chemical from below the semiconductor substrate. A chemical supply part is provided above the gas supply part and below the semiconductor substrate and is configured to discharge the chemical caused to circulate from the processing tank, towards the air bubbles appearing from the gas supply part.

2 Claims, 9 Drawing Sheets

(56) References Cited

U.S. PATENT DOCUMENTS

| | | | |
|---|---|---|---|
| 2008/0105286 A1 | 5/2008 | Kizawa et al. | |
| 2017/0309501 A1 | 10/2017 | Kitamura et al. | |
| 2018/0082862 A1 | 3/2018 | Ashidate et al. | |
| 2018/0233383 A1 | 8/2018 | Ashidate et al. | |
| 2019/0080937 A1* | 3/2019 | Tsuchiya | H01L 21/67253 |
| 2019/0172734 A1* | 6/2019 | Honda | H01L 21/67253 |

FOREIGN PATENT DOCUMENTS

| | | |
|---|---|---|
| JP | 10-229066 | 8/1998 |
| JP | 10-335295 | 12/1998 |
| JP | 11-150091 | 6/1999 |
| JP | 2000-58493 | 2/2000 |
| JP | 2000-147474 | 5/2000 |
| JP | 2002-93764 | 3/2002 |
| JP | 3493030 | 2/2004 |
| JP | 2004-327826 | 11/2004 |
| JP | 2006-108512 | 4/2006 |
| JP | 2008-84903 | 4/2008 |
| JP | 2008-147637 | 6/2008 |
| JP | 2008-210910 | 9/2008 |
| JP | 4403177 | 1/2010 |
| JP | 2010-103379 | 5/2010 |
| JP | 2015-115456 | 6/2015 |
| JP | 2016-9729 | 1/2016 |
| JP | 2017-69529 | 4/2017 |
| JP | 2017-130483 | 7/2017 |
| JP | 2017-195338 | 10/2017 |
| JP | 2018-46262 | 3/2018 |
| JP | 2018-133551 A | 8/2018 |

* cited by examiner

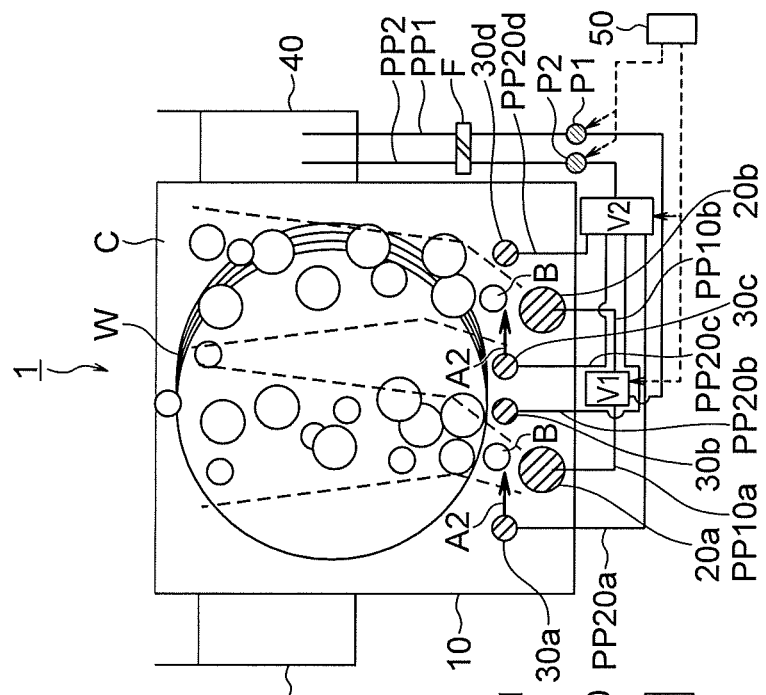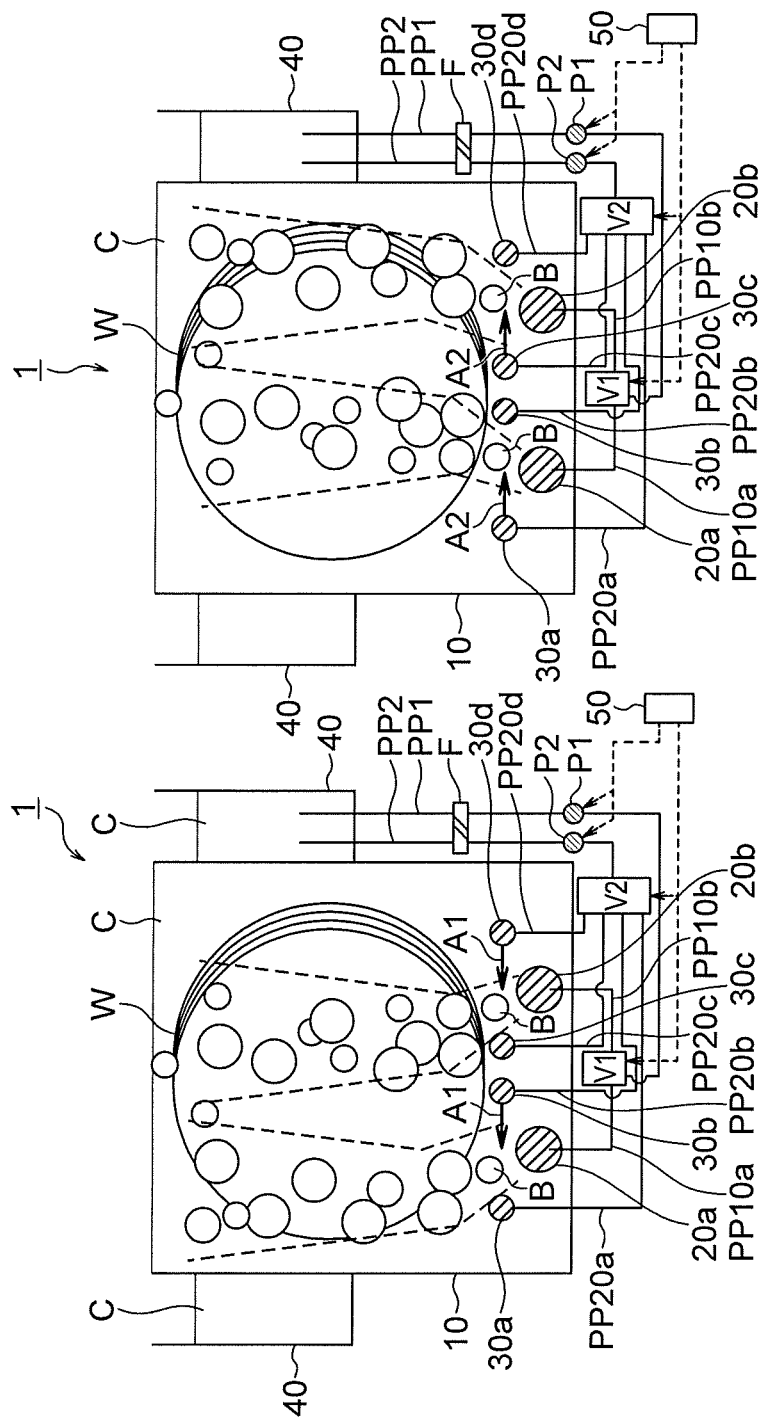

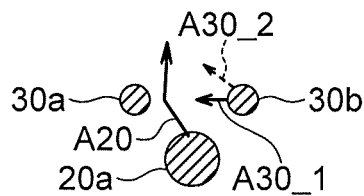 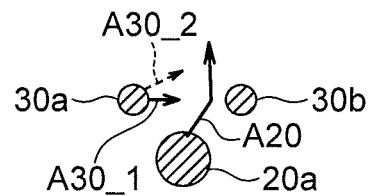
FIG.2A  FIG.2B
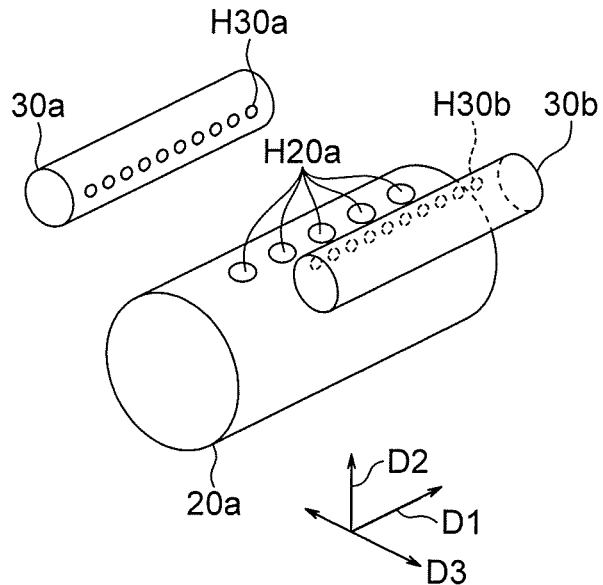
FIG. 3

SEMICONDUCTOR PROCESSING DEVICE

CROSS REFERENCE TO RELATED APPLICATIONS

This application is based upon and claims the benefit of priority from the prior Japanese Patent Application No. 2018-028997, filed on Feb. 21, 2018, the entire contents of which are incorporated herein by reference.

FIELD

The embodiments of the present invention relate to a semiconductor processing device.

BACKGROUND

In a semiconductor processing device, such as a batch cleaning device, a chemical in a processing tank is caused to circulate even during processing of a semiconductor substrate, in order to keep the concentration or the like of the chemical uniform. However, a flow rate of the chemical is high near a nozzle that supplies the chemical, and becomes lower as the distance from the nozzle increases. This variation in the flow rate of the chemical causes a variation in a processing rate, such as an etching rate, on a surface of the semiconductor substrate. Further, in a region where the flow rate of the chemical is low, precipitation of a by-product, such as silica, may occur on the surface of the semiconductor substrate.

BRIEF DESCRIPTION OF THE DRAWINGS

FIGS. 1A and 1B are conceptual diagrams illustrating a configuration example and an operation example of a semiconductor processing device according to a first embodiment;

FIGS. 2A and 2B are diagrams illustrating an arrangement relation among the gas supply pipe and the pair of chemical supply pipes in more detail;

FIG. 3 is a perspective view illustrating a configuration example of the gas supply pipe and the pair of chemical supply pipes;

DETAILED DESCRIPTION

Figure 4:
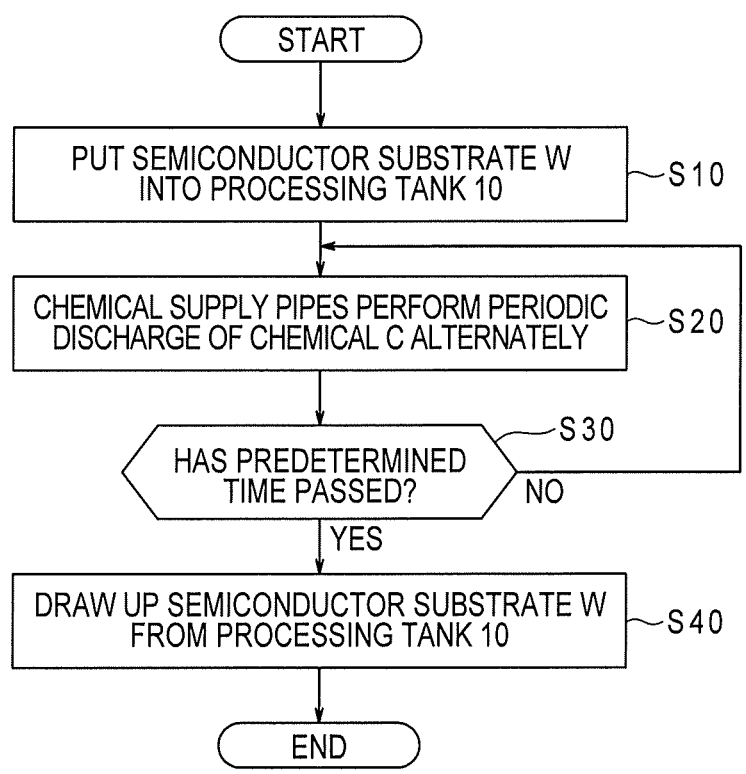
FIG. 4 is a flowchart illustrating an example of a processing method that uses the processing device according to the first embodiment.

Embodiments will now be explained with reference to the accompanying drawings. The present invention is not limited to the embodiments. The drawings are schematic or conceptual, and the ratios and the like among respective parts are not necessarily the same as those of actual products. In the present specification and the drawings, elements identical to those described in the foregoing drawings are denoted by like reference characters and detailed explanations thereof are omitted as appropriate.

A semiconductor processing device according to an embodiment includes a processing tank configured to store a chemical therein to allow a semiconductor substrate to be immersed in the chemical. A gas supply part is provided below the semiconductor substrate accommodated in the processing tank and is configured to supply air bubbles to the chemical from below the semiconductor substrate. A chemical supply part is provided above the gas supply part and below the semiconductor substrate and is configured to discharge the chemical caused to circulate from the processing tank, towards the air bubbles appearing from the gas supply part.

First Embodiment

FIGS. 1A and 1B are conceptual diagrams illustrating a configuration example and an operation example of a semiconductor processing device 1 according to a first embodiment. The semiconductor processing device (hereinafter, simply "processing device") 1 is a device that processes a plurality of semiconductor substrates W immersed in a chemical C, such as a batch cleaning device and a wet etching device.

The processing device 1 includes a processing tank 10, gas supply pipes 20a and 20b, chemical supply pipes 30a to 30d, a circulation tank 40, a controller 50, valves V1 and V2, pumps P1 and P2, pipes PP1, PP2, PP10a, PP10b, and PP20a to PP20d, and a filter F.

The processing tank 10 stores the chemical C therein and can accommodate one or a plurality of semiconductor substrates W in a substantially vertically standing state. The semiconductor substrate W is placed on a lifter (see 60 in FIG. 9) to stand substantially vertically, and is accommodated in the processing tank 10 together with the lifter. The semiconductor substrate W is immersed in the chemical C by being accommodated in the processing tank 10.

The gas supply pipes 20a and 20b serving as gas supply parts are provided near the bottom of the processing tank 10 and are located below the semiconductor substrate W accommodated in the processing tank 10. The gas supply pipes 20a and 20b supply air bubbles B to the chemical C from below the semiconductor substrate W.

The chemical supply pipes 30a to 30d serving as chemical supply parts are provided above the gas supply pipes 20a and 20b and below the semiconductor substrate W. The chemical supply pipes 30a to 30d discharge the chemical C towards the air bubbles B appearing from the gas supply pipes 20a and 20b. The chemical C is discharged in a direction of an arrow A1 or A2 and turns a moving direction of the air bubbles B.

The air bubbles B start to move in the chemical C in a substantially vertical upward direction. However, because of the flow pressure of the chemical C from the chemical supply pipes 30a to 30d, the air bubbles B move up while being pushed to move in the direction of the arrow A1 or A2.

For example, in FIG. 1A, the chemical supply pipes 30b and 30d discharge the chemical C in the direction of the arrow A1, and the air bubbles B move up while being turned in the direction of the arrow A1. In FIG. 1B, the chemical supply pipes 30a and 30c discharge the chemical C in the direction of the arrow A2, and the air bubbles B move up while being turned in the direction of the arrow A2. In this manner, the chemical supply pipes 30a to 30d can control the moving direction of the air bubbles B to some extent by discharging the chemical C.

The circulation tank 40 stores therein the chemical C overflowing from the processing tank 10. The chemical C in the circulation tank 40 is returned to the processing tank 10 via the pipes PP1 and PP2, the pumps P1 and P2, and the valves V1 and V2. With this operation, the chemical C is caused to circulate between the processing tank 10 and the circulation tank 40. The chemical C can be filtered by the filter F during circulation.

The circulation tank 40 is connected to the valve V1 via the pipe PP1 and to the valve V2 via the pipe PP2. The pump P1 is provided in the pipe PP1. The pump P1 feeds the chemical C from the circulation tank 40 to the valve V1. The pump P2 is provided in the pipe PP2. The pump P2 feeds the chemical C from the circulation tank 40 to the valve V2. The filter F removes impurities mixed in the chemical C. The filter F can be provided in each of the pipes PP1 and PP2 or can be shared by the pipes PP1 and PP2.

The valve V1 is connected to the gas supply pipe 20a via the pipe PP10a and to the gas supply pipe 20b via the pipe PP10b. The valve V1 mixes gas into the chemical C and supplies the chemical C and the gas to the gas supply pipes 20a and 20b substantially evenly. With this operation, the gas supply pipes 20a and 20b can discharge substantially equal amounts of air bubbles B. Inert gas, such as nitrogen, is used as the gas, for example. As the chemical C, hot phosphoric acid solution is used in a case of removing a silicon nitride film, and hydrofluoric acid solution is used in a case of removing a silicon oxide film, for example. The chemical C can be optionally selected in accordance with the kind of a film to be removed, and is not limited to those described above.

Further, the amount of the gas to be mixed into the chemical C can be adjusted by adjusting the valve V1. In a case where the amounts of the air bubbles B discharged from the gas supply pipes 20a and 20b are biased, the valve V1 is adjusted to cause the gas supply pipes 20a and 20b to discharge substantially equal amounts of air bubbles B. In this manner, the amounts of the air bubbles B discharged from the gas supply pipes 20a and 20b and the balance between them can be adjusted.

The valve V2 is connected to the chemical supply pipes 30a to 30d via the pipes PP20a to PP20d, respectively. The valve V2 adjusts the amount of the chemical C to be supplied to each of the chemical supply pipes 30a to 30d. In a case of discharging the chemical C in the direction of the arrow A1 as illustrated in FIG. 1A, for example, the valve V2 supplies the chemical C to the chemical supply pipes 30b and 30d and stops supply to the chemical supply pipes 30a and 30c. With this operation, the chemical supply pipes 30b and 30d discharge the chemical C towards the air bubbles B. Meanwhile, in a case of discharging the chemical C in the direction of the arrow A2 as illustrated in FIG. 1B, the valve V2 supplies the chemical C to the chemical supply pipes 30a and 30c and stops supply to the chemical supply pipes 30b and 30d. With this operation, the chemical supply pipes 30a and 30c discharge the chemical C towards the air bubbles B. In this manner, it is possible to switch a discharge direction of the chemical C discharged from the chemical supply pipes 30a to 30d by adjusting the valve V2. Further, it is also possible to change the flow rate or the flow pressure of the chemical C discharged from the chemical supply pipes 30a to 30d by adjusting the valve V2. The flow rate or the flow pressure of the chemical C can be adjusted by changing an output of the pump P2.

The state of FIG. 1A and the state of FIG. 1B can be switched in a short time instantly. However, in order to improve uniformity of a surface treatment for the semiconductor substrate W, switching between the state of FIG. 1A and the state of FIG. 1B can be performed for a relatively long time. In this case, it suffices that the controller 50 gradually changes the amount or the flow pressure of the chemical C discharged from the chemical supply pipes 30a to 30d by adjusting the valve V2 or the pump P2.

The controller 50 controls operations of the valves V1 and V2 and the pumps P1 and P2.

As described above, the chemical C is used not only for processing the semiconductor substrate W, but also for controlling the moving direction of the air bubbles B by being discharged towards the air bubbles B from the gas supply pipes 20a and 20b.

A pair of chemical supply pipes 30a and 30b is provided to correspond to one gas supply pipe 20a. The chemical supply pipes 30a and 30b are arranged on both sides above the gas supply pipe 20a substantially symmetrically. That is, the chemical supply pipe 30a is arranged at a position shifted from immediately above the gas supply pipe 20a to one side in a substantially horizontal direction, and the chemical supply pipe 30b is arranged at a position shifted from immediately above the gas supply pipe 20a to the other side in the substantially horizontal direction. In a vertical cross section as illustrated in FIGS. 1A and 1B, the chemical supply pipes 30a and 30b and the gas supply pipe 20a are respectively arranged at apices of a substantially isosceles triangle including a straight line connecting the chemical supply pipe 30a and the chemical supply pipe 30b to each other as a bottom.

Similarly, a pair of chemical supply pipes 30c and 30d is provided to correspond to one gas supply pipe 20b. The chemical supply pipes 30c and 30d are arranged on both sides above the gas supply pipe 20b substantially symmetrically. That is, the chemical supply pipe 30c is arranged at a position shifted from immediately above the gas supply pipe 20b to one side in the substantially horizontal direction, and the chemical supply pipe 30d is arranged at a position shifted from immediately above the gas supply pipe 20b to the other side in the substantially horizontal direction. In the vertical cross section as illustrated in FIGS. 1A and 1B, the chemical supply pipes 30c and 30d and the gas supply pipe 20b are respectively arranged at apices of a substantially isosceles triangle including a straight line connecting the chemical supply pipe 30c and the chemical supply pipe 30d to each other as a bottom.

In the present embodiment, two sets of a gas supply pipe and one pair of chemical supply pipes are provided. However, the number of the sets to be provided can be only one, or three or more.

FIGS. 2A and 2B are diagrams illustrating an arrangement relation among the gas supply pipe 20a and the pair of chemical supply pipes 30a and 30b in more detail. An arrangement relation among the chemical supply pipes 30c and 30d and the gas supply pipe 20b can be identical to an arrangement relation among the chemical supply pipes 30*a* and 30*b* and the gas supply pipe 20*a*.

The chemical supply pipes 30*a* and 30*b* are arranged to be shifted from immediately above the gas supply pipe 20*a* in the substantially horizontal direction, and discharge the chemical C towards the air bubbles B in the substantially horizontal direction (an arrow A30_1) or an inclined direction (an arrow A30_2). With this operation, the air bubbles B move up from immediately above the gas supply pipe 20*a* while being turned in a discharge direction of the chemical C (the arrow A30_1 or A30_2), as illustrated by an arrow A20.

FIG. 3 is a perspective view illustrating a configuration example of the gas supply pipe 20*a* and the pair of chemical supply pipes 30*a* and 30*b*. Because the gas supply pipe 20*b* and the chemical supply pipes 30*c* and 30*d* can have configurations identical to those of the gas supply pipe 20*a* and the chemical supply pipes 30*a* and 30*b*, illustrations thereof are omitted.

The gas supply pipe 20*a* is a pipe extending in an arrangement direction D1 of the semiconductor substrates W. The gas supply pipe 20*a* has a hole H20*a* provided to be opened in an upward direction D2. The air bubbles B are supplied from the hole H20*a* towards the semiconductor substrate W located above the hole H20*a*.

The chemical supply pipes 30*a* and 30*b* are pipes each extending in the arrangement direction D1 of the semiconductor substrates W. The chemical supply pipes 30*a* and 30*b* respectively have holes H30*a* and H30*b* opened in a substantially horizontal direction D3 or an obliquely upward direction from the horizontal direction D3. With this configuration, the chemical supply pipes 30*a* and 30*b* discharge the chemical C towards the air bubbles B from the gas supply pipe 20*a*.

The chemical supply pipes 30*a* and 30*b* discharge the chemical C alternately. That is, the state of FIG. 2A and the state of FIG. 2B are alternately repeated. With this operation, it is possible to shake the air bubbles B in the substantially horizontal direction D3 and to cause the air bubbles B to hit the entire surface of the semiconductor substrate W.

If the air bubbles B hit only a portion of the surface of the semiconductor substrate W, the flow rate of the chemical C varies on the surface of the semiconductor substrate W, so that a processing rate (for example, an etching rate) also varies on the surface of the semiconductor substrate W. In this case, the surface of the semiconductor substrate W may be excessively or insufficiently processed locally. Further, if the flow rate of the chemical C varies on the surface of the semiconductor substrate W, precipitation of a by-product (for example, silica) on the surface of the semiconductor substrate W occurs in a portion where the flow rate of the chemical C is low.

On the other hand, the processing device 1 according to the present embodiment can cause the air bubbles B to hit the entire surface of the semiconductor substrate W, and therefore can make the processing rate on the entire surface of the semiconductor substrate W substantially uniform. Accordingly, it is possible to make the processing rate on the surface of the semiconductor substrate W substantially uniform and to suppress precipitation of a by-product on the surface of the semiconductor substrate W.

A period of discharge of the chemical C in each chemical supply pipe 30*a* or 30*b* is not particularly limited. However, it is preferable that a discharge period of time of the chemical supply pipe 30*a* and a discharge period of time of the chemical supply pipe 30*b* are substantially equal to each other in order to cause the air bubbles B to hit the surface of the semiconductor substrate W substantially uniformly.

In FIG. 3, the gas supply pipes 20*a* and 20*b* and the chemical supply pipes 30*a* to 30*d* are pipes each having a circular cross section. However, the cross-sectional shape of each of the gas supply pipes 20*a* and 20*b* and the chemical supply pipes 30*a* to 30*d* is not limited thereto, but can be elliptical or polygonal, for example. Also, the shape of each of the holes H20*a*, H30*a*, and H30*b* can be an elliptical or polygonal shape, other than a circular shape.

An operation of the processing device 1 is explained next.

FIG. 4 is a flowchart illustrating an example of a processing method that uses the processing device 1 according to the first embodiment. It is assumed that the processing tank 10 stores the chemical C therein.

First, the semiconductor substrate W is put into the processing tank 10 while being placed on a lifter, so that the semiconductor substrate W is immersed in the chemical C (S10).

Subsequently, the controller 50 controls the valves V1 and V2 and the pumps P1 and P2 to start discharge of the air bubbles B and the chemical C. At this time, the gas supply pipes 20*a* and 20*b* respectively supply the air bubbles B to the semiconductor substrate W above the gas supply pipes 20*a* and 20*b*. The chemical supply pipes 30*a* and 30*b* perform periodic discharge of the chemical C alternately. The chemical supply pipes 30*c* and 30*d* also perform periodic discharge of the chemical C alternately (S20). With this operation, the air bubbles B move upward while being shaken in the substantially horizontal direction.

Step S20 is continued until a predetermined time passes (NO at Step S30).

When the predetermined time has passed (YES at Step S30), the lifter draws up the semiconductor substrate W from the processing tank 10 (S40). With this step, a series of processes is ended.

As described above, the processing device 1 according to the present embodiment can shake the air bubbles B by discharging the chemical C towards the air bubbles B, thereby causing the air bubbles B to hit the entire surface of the semiconductor substrate W substantially uniformly. Accordingly, it is possible to make a processing rate on the surface of the semiconductor substrate W substantially uniform and to suppress precipitation of a by-product on the surface of the semiconductor substrate W.

(Modification)

Figure 5:
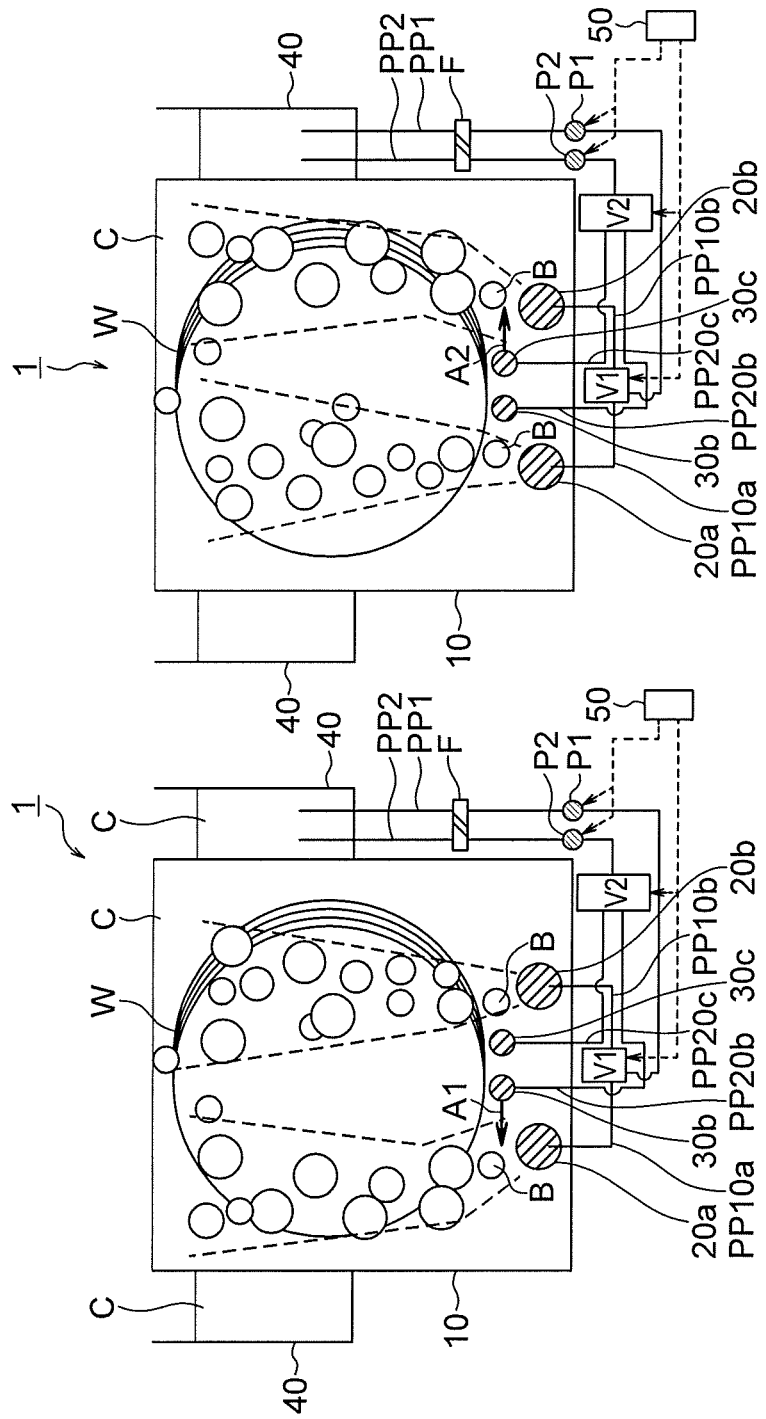
FIGS. 5A and 5B are conceptual diagrams illustrating a configuration example and an operation example of the processing device according to a modification of the first embodiment.

FIGS. 5A and 5B are conceptual diagrams illustrating a configuration example and an operation example of the processing device 1 according to a modification of the first embodiment. The processing device 1 according to the present modification is different from that of the first embodiment in that one chemical supply pipe is provided for each of the gas supply pipes 20*a* and 20*b*. For example, in the example illustrated in FIGS. 5A and 5B, the chemical supply pipe 30*b* is provided for the gas supply pipe 20*a*, and the chemical supply pipe 30*c* is provided for the gas supply pipe 20*b*. Therefore, the chemical supply pipes 30*a* and 30*d* and the pipes PP20*a* and PP20*d* are not provided.

The chemical supply pipe 30*b* is arranged above the gas supply pipe 20*a* to be shifted to one side, and the chemical supply pipe 30*c* is arranged above the gas supply pipe 20*b* to be shifted to one side. An arrangement relation between the chemical supply pipe 30*b* and the gas supply pipe 20*a* and an arrangement relation between the chemical supply pipe 30*c* and the gas supply pipe 20*b* can be identical to those in the first embodiment.

Further, the chemical supply pipes 30*b* and 30*c* perform periodic discharge of the chemical C to the air bubbles B alternately. For example, when the chemical supply pipe 30*b* discharges the chemical C in the direction of the arrow A1 as illustrated in FIG. 5A, the chemical supply pipe 30*c* stops discharge of the chemical C. Therefore, the air bubbles B from the gas supply pipe 20*a* are turned in the direction of the arrow A1, but the air bubbles B from the gas supply pipe 20*b* are not turned so much. Meanwhile, when the chemical supply pipe 30*c* discharges the chemical C in the direction of the arrow A2 as illustrated in FIG. 5B, the chemical supply pipe 30*b* stops discharge of the chemical C. Therefore, the air bubbles B from the gas supply pipe 20*b* are turned in the direction of the arrow A2, but the air bubbles B from the gas supply pipe 20*a* are not turned so much.

In this manner, the chemical supply pipes 30*b* and 30*c* discharge the chemical C alternately. That is, the state of FIG. 5A and the state of FIG. 5B are alternately repeated. Also in this case, it is possible to shake the air bubbles B in the substantially horizontal direction, so that a variation in a processing rate on the surface of the semiconductor substrate W can be reduced to some extent.

Alternatively, the chemical supply pipes 30*b* and 30*c* can perform periodic discharge of the chemical C to the air bubbles B simultaneously. For example, the chemical supply pipe 30*c* discharges the chemical C in the direction of the arrow A2 at the same time as the chemical supply pipe 30*b* discharges the chemical C in the direction of the arrow A1. In this case, the air bubbles B from the gas supply pipe 20*a* are turned in the direction of the arrow A1, and the air bubbles B from the gas supply pipe 20*b* are turned in the direction of the arrow A2. Meanwhile, when the chemical supply pipe 30*b* stops discharge of the chemical C, the chemical supply pipe 30*c* also stops discharge of the chemical C. Therefore, the air bubbles B from the gas supply pipes 20*a* and 20*b* move substantially vertically upward.

In this manner, the chemical supply pipes 30*b* and 30*c* can discharge the chemical C simultaneously. Also in this case, it is possible to shake the air bubbles B in the substantially horizontal direction, so that a variation in a processing rate on the surface of the semiconductor substrate W can be reduced to some extent.

Second Embodiment

Figure 6:
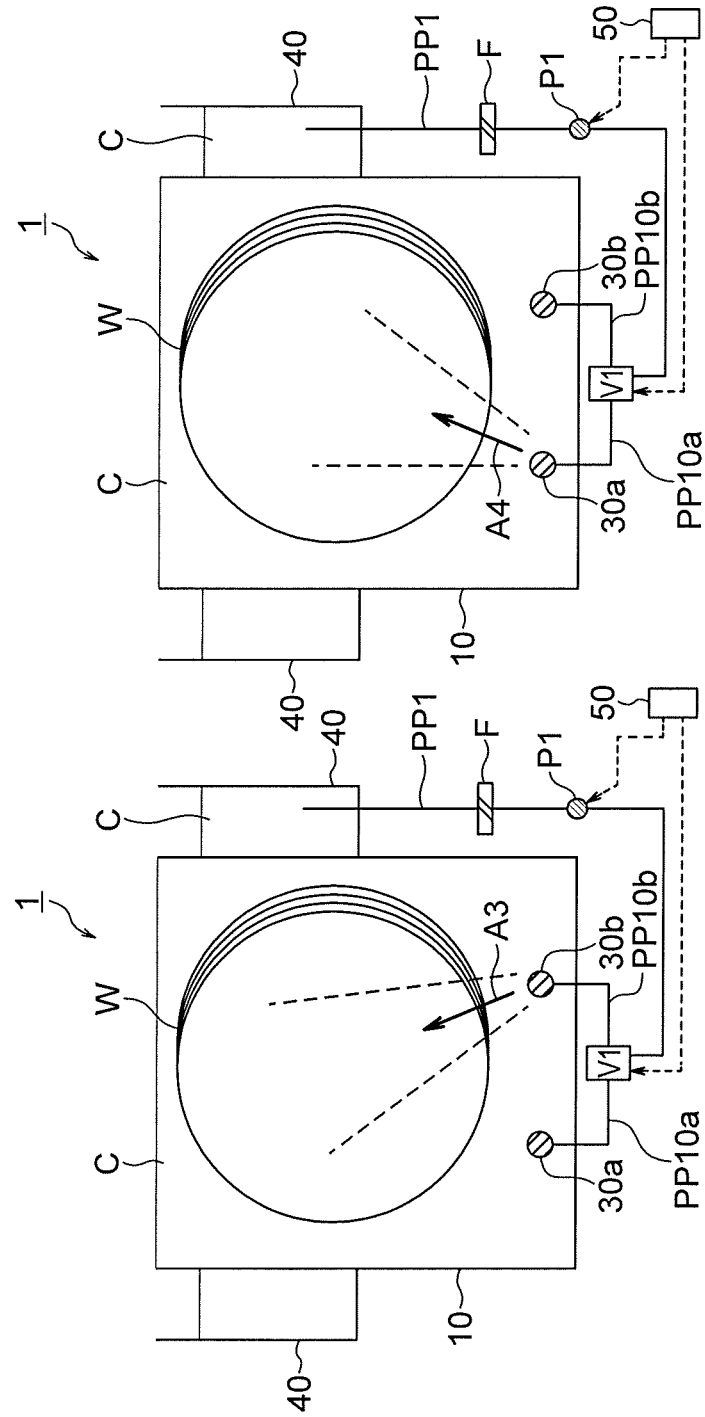
FIGS. 6A and 6B are conceptual diagrams illustrating a configuration example and an operation example of the processing device according to a second embodiment.

FIGS. 6A and 6B are conceptual diagrams illustrating a configuration example and an operation example of the processing device 1 according to a second embodiment. In the first embodiment, the moving direction of the air bubbles B is shaken by the chemical C from the chemical supply pipes 30*a* to 30*d*, so that the flow rate of the chemical C on the surface of the semiconductor substrate W is made substantially uniform by the air bubbles B. On the other hand, the processing device 1 according to the second embodiment does not use the air bubbles B, but makes the flow rate of the chemical C on the surface of the semiconductor substrate W substantially uniform by the chemical C from the chemical supply pipes 30*a* and 30*b*. Therefore, the processing device 1 according to the second embodiment includes the chemical supply pipes 30*a* and 30*b*, but does not include the gas supply pipes 20*a* and 20*b*.

The circulation tank 40, the pipe PP1, the pump P1, and the filter F can have configurations identical to those in the first embodiment.

The valve V1 is connected to the chemical supply pipe 30*a* via the pipe PP10*a* and to the chemical supply pipe 30*b* via the pipe PP10*b*. The valve V1 supplies the chemical C to the chemical supply pipes 30*a* and 30*b* substantially evenly. The valve V1 according to the second embodiment does not mix gas into the chemical C. Therefore, the chemical supply pipes 30*a* and 30*b* discharge substantially equal amounts of chemical C. In a case where the amounts of the chemical C discharged from the chemical supply pipes 30*a* and 30*b* are biased, the valve V1 can be adjusted to cause the chemical supply pipes 30*a* and 30*b* to discharge substantially equal amounts of chemical C.

The paired chemical supply pipes 30*a* and 30*b* are arranged on both sides below the semiconductor substrate W substantially symmetrically. The chemical supply pipes 30*a* and 30*b* discharge the chemical C from obliquely below the semiconductor substrate W immersed in the chemical C towards the semiconductor substrate W.

Figure 7:
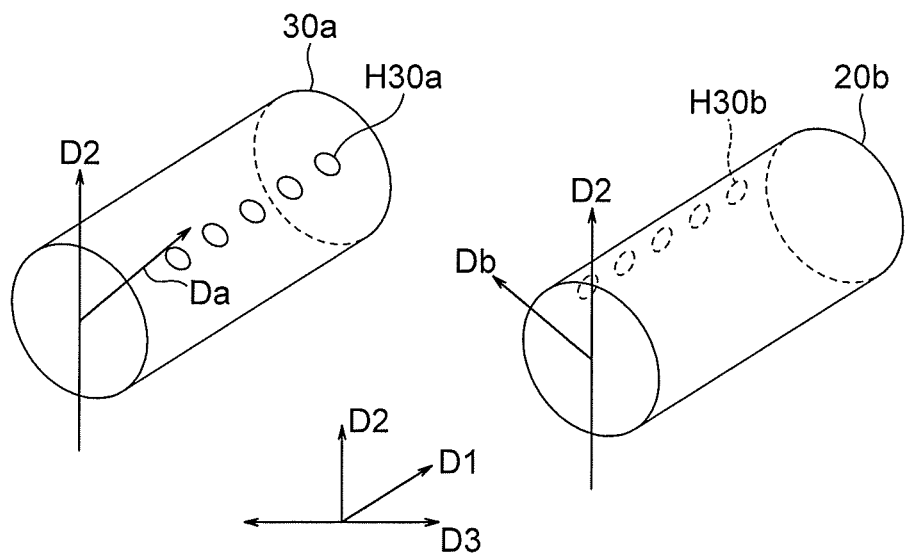
FIG. 7 is a perspective view illustrating the configuration of the chemical supply pipes in more detail.

FIG. 7 is a perspective view illustrating the configuration of the chemical supply pipes 30*a* and 30*b* in more detail. The chemical supply pipes 30*a* and 30*b* respectively have the holes H30*a* and H30*b* opened towards the center of the semiconductor substrate W or the center of the processing tank 10. In other words, the holes H30*a* and H30*b* are respectively opened in a direction Da and a direction Db that are inclined from a vertical direction D2 to sides facing each other (to an opposing direction). With this configuration, the chemical supply pipes 30*a* and 30*b* can discharge the chemical C towards the center of the semiconductor substrate W.

In the second embodiment, the controller 50 controls the valve V1 in such a manner that the chemical C is alternately discharged from the paired chemical supply pipes 30*a* and 30*b* to the semiconductor substrate W. That is, the state of FIG. 6A and the state of FIG. 6B are alternately repeated. In this case, because one of the chemical supply pipes 30*a* and 30*b* discharges the chemical C in the short term, a flow rate of the chemical C on the surface of the semiconductor substrate W is locally different.

However, when being averaged in the entire processing in the long term, the flow rate of the chemical C can be made close to a uniform rate on the surface of the semiconductor substrate W.

For example, if both the chemical supply pipes 30*a* and 30*b* discharge the chemical C simultaneously, a flow of the chemical C from the chemical supply pipe 30*a* and a flow of the chemical C from the chemical supply pipe 30*b* collide with each other near the center of the semiconductor substrate W and cancel out each other. Therefore, the flow rate of the chemical C is relatively high to a central portion of the semiconductor substrate W, but becomes lower in an upper portion of the semiconductor substrate W. Due to this variation in the flow rate, the in-plane uniformity of the processing is deteriorated.

Further, because the chemical supply pipes 30*a* and 30*b* continuously discharge the chemical C, the flow rate of the chemical C becomes high near the chemical supply pipes 30*a* and 30*b*. Therefore, the processing can easily progress in a region near the chemical supply pipes 30*a* and 30*b* on the surface of the semiconductor substrate W. Accordingly, the in-plane uniformity of the processing is further deteriorated.

On the other hand, in the second embodiment, the chemical supply pipes 30*a* and 30*b* alternately discharge the chemical C to the semiconductor substrate W. In this case, one of the flow of the chemical C from the chemical supply pipe 30*a* and the flow of the chemical C from the chemical supply pipe 30*b* neither affects nor inhibits the other. Therefore, the flow rate of the chemical C reaches the central portion of the semiconductor substrate W and a portion located above the central portion, so that a difference between the flow rate in a lower portion of the semiconductor substrate W and that in the upper portion becomes small. Accordingly, the in-plane uniformity of the processing can be improved.

Further, the chemical supply pipes 30a and 30b perform periodic discharge of the chemical C alternately. Therefore, although the flow rate of the chemical C intermittently becomes high near the chemical supply pipes 30a and 30b, an average flow rate of the chemical C becomes close to a uniform flow rate on the surface of the semiconductor substrate W in the entire process. Accordingly, the in-plane uniformity of the processing can be further improved. Therefore, the second embodiment can achieve effects identical to those in the first embodiment.

The state of FIG. 6A and the state of FIG. 6B can be switched in a short time instantly. However, in order to improve uniformity of a surface treatment for the semiconductor substrate W, switching between the state of FIG. 6A and the state of FIG. 6B can be performed for a relatively long time. In this case, it suffices that the controller 50 gradually changes the amount or the flow rate of the chemical C discharged from each of the chemical supply pipes 30a and 30b by adjusting the valve V1 or the pump P1.

(Discharge Period of Time and Discharge-Stop Period of Time of Chemical C)

Figure 8:
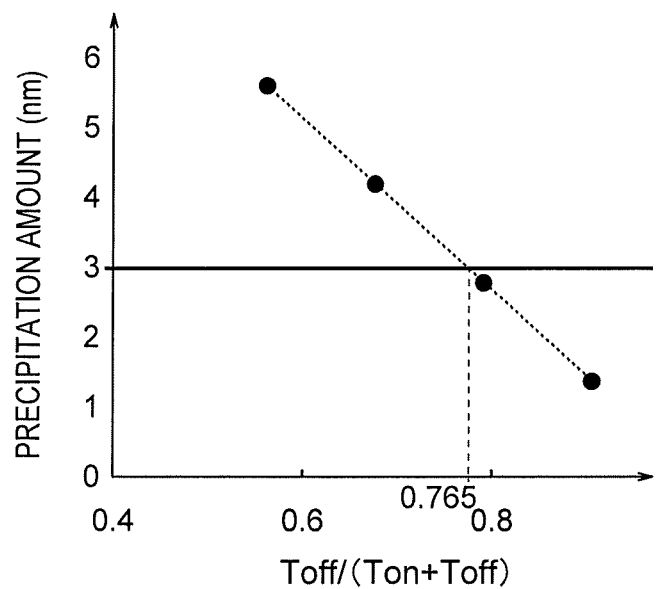
FIG. 8 is a graph illustrating a relation between a ratio of a discharge-stop period of time of the chemical C according to the second embodiment and the precipitation amount of a by-product.

FIG. 8 is a graph illustrating a relation between a ratio of a discharge-stop period of time of the chemical C according to the second embodiment and the precipitation amount of a by-product. The vertical axis of this graph represents the precipitation amount of silica ($SiO_2$) as a by-product, for example. The horizontal axis represents a ratio of a period of time during which the chemical supply pipe 30a or 30b stops discharge of the chemical C in a process. For example, it is assumed that each of the chemical supply pipes 30a and 30b discharges the chemical C with a certain discharge period. Further, it is assumed that a discharge period of time during which the chemical supply pipe 30a or 30b discharges the chemical C is Ton and a discharge-stop period of time during which the chemical supply pipe 30a or 30b stops discharge of the chemical C is Toff. In this case, the discharge period is the sum (Ton+Toff) of the discharge period of time Ton and the discharge-stop period of time Toff. The horizontal axis represents a ratio (Toff/(Ton+Toff)) of the discharge-stop period of time Toff to one discharge period (Ton+Toff).

Figure 12:
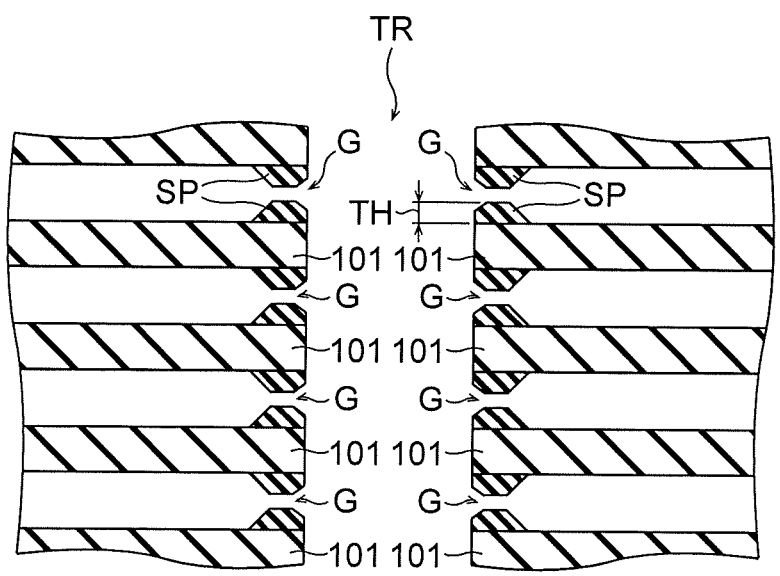
FIG. 12 is a diagram illustrating a cross section in a manufacturing process of a three-dimensional memory cell array, after a silicon nitride film is removed.

It is found from FIG. 8 that the precipitation amount of silica increases as the ratio (Toff/(Ton+Toff)) is lowered. For example, a NAND EEPROM (Electrically Erasable Programmable Read-Only Memory) may include a three-dimensional memory cell array in which memory cells are arranged three-dimensionally. In this case, a trench TR is formed in a stacking direction of a stack body of a silicon oxide film and a silicon oxide film, and a silicon nitride film of the stack body is replaced with metal. It is necessary to remove the silicon nitride film once in a transverse direction (a direction perpendicular to the stacking direction) via the trench TR. For example, FIG. 12 is a diagram illustrating a cross section in a manufacturing process of a three-dimensional memory cell array, after a silicon nitride film is removed. After the silicon nitride film is removed, a gap G extending in the transverse direction is formed between silicon oxide films 101. The gap G becomes narrow near the trench TR because a by-product SP is deposited in an end portion of the silicon oxide film 101. The precipitation amount of the by-product illustrated in FIG. 8 is a film thickness TH of this by-product SP deposited in the silicon oxide film 101 in the stacking direction. That is, the precipitation amount of the by-product SP is about half of a difference between the width of the gap G in the stacking direction near the trench TR and the width of the gap G in the stacking direction at a position away from the trench TR. It is preferable to suppress the precipitation amount of this by-product SP to be about 3 nm or less. Precipitation of a large amount of by-product SP leads to an open failure or a short-circuit failure of a wire (for example, a word line). Therefore, it is preferable to suppress the precipitation amount of the by-product SP to be about 3 nm or less in the above example. In this case, the ratio (Toff/(Ton+Toff)) is set to 0.765 or more. That is, it is preferable that the ratio of the discharge-stop period of time Toff of the chemical supply pipe 30a or 30b in one discharge period (Ton+Toff) is 0.765 or more and a ratio of the discharge period of time Ton of the chemical supply pipe 30a or 30b is 0.235 or less. However, the precipitation amount of a by-product increases in proportion to the length of the discharge-stop period of time Toff. Therefore, a lower limit of the ratio of the discharge-stop period of time Toff is set based on a processing time. As described above, by making the ratio (Toff/(Ton+Toff)) of the discharge-stop period of time to the discharge period of the chemical supply pipe 30a or 30b equal to or larger than 0.765, it is possible to improve the in-plane uniformity of the processing for the semiconductor substrate W and to suppress precipitation of a by-product.

The graph of FIG. 8 can be also applied to the modification of the first embodiment. That is, when the chemical supply pipes 30b and 30c discharge the chemical C alternately or simultaneously, a ratio (Toff/(Ton+Toff)) is preferably 0.765 or more, assuming that a period of time during which the chemical supply pipe 30b or 30c discharges the chemical C is a discharge period of time Ton and a period of time during which the chemical supply pipe 30b or 30c stops discharge of the chemical C is a discharge-stop period of time Toff. By setting the discharge period of time Ton and the discharge-stop period of time Toff in this manner, it is possible to improve the in-plane uniformity of the processing for the semiconductor substrate W and to suppress precipitation of a by-product also in the above modification.

Third Embodiment

Figure 9:
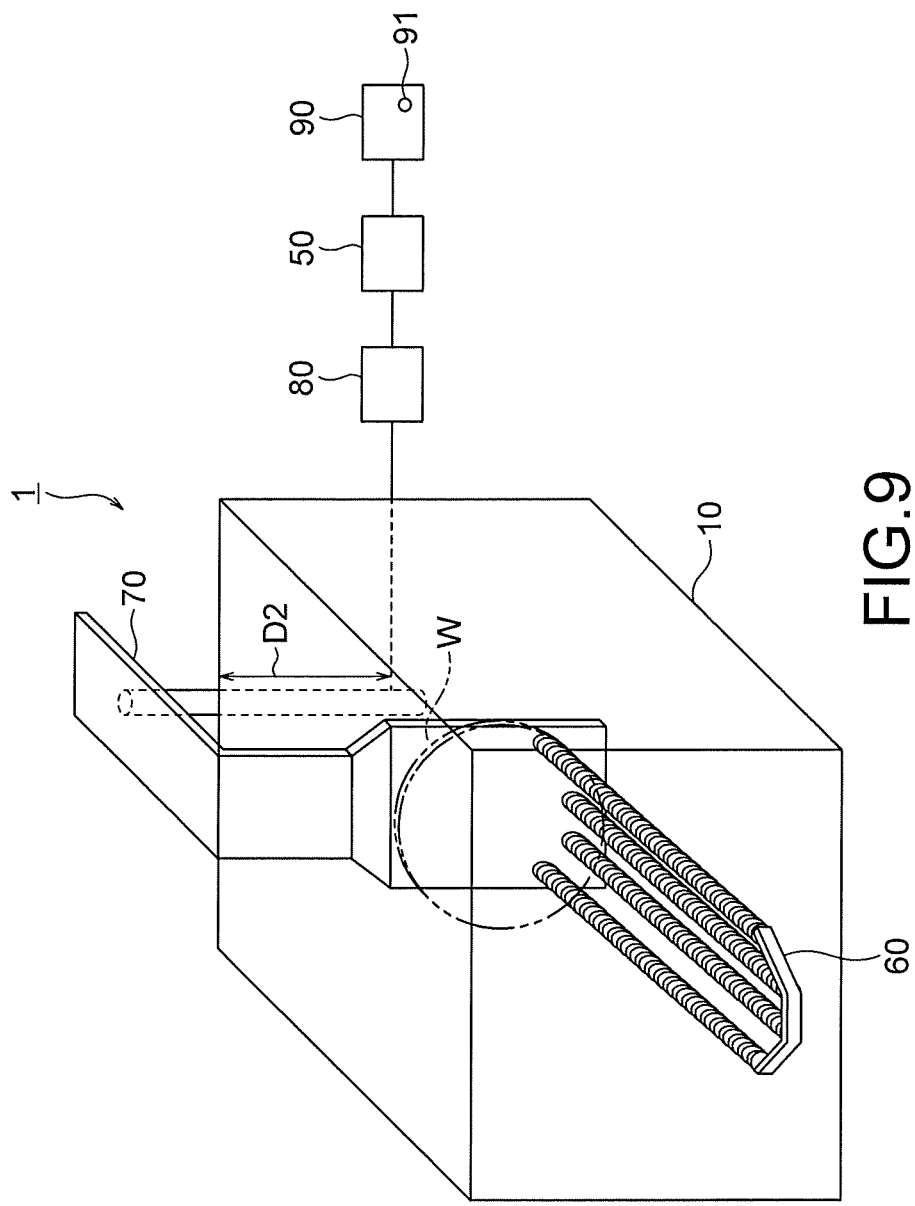
FIG. 9 is a conceptual diagram illustrating a configuration example of the processing device according to a third embodiment.

FIG. 9 is a conceptual diagram illustrating a configuration example of the processing device 1 according to a third embodiment. In the third embodiment, a lifter 60 shakes the semiconductor substrate W in the processing tank 10 substantially vertically. This shaking reduces a variation in a flow rate of the chemical C on the surface of the semiconductor substrate W.

The processing device 1 according to the third embodiment includes the lifter 60 on which the semiconductor substrate W can be placed to stand substantially vertically. The semiconductor substrate W can be accommodated in the processing tank 10 while being placed on the lifter 60, and can be immersed in the chemical C. The lifter 60 serving as a placing part is connected to a lifter support part 70 and can be moved in the substantially vertical direction D2 together with the lifter support part 70.

A driving part 80 can move the lifter 60 together with the lifter support part 70 in the substantially vertical direction D2. The driving part 80 is controlled by the controller 50.

The controller 50 causes the lifter 60 to reciprocate (be shaken) at a speed and an acceleration that make the flow rate of the chemical C with respect to the surface of the semiconductor substrate W equal to or higher than a predetermined threshold (a first threshold) and that prevent the semiconductor substrate W from floating from the lifter 60.

By shaking the semiconductor substrate W in the chemical C, the surface of the semiconductor substrate W is relatively moved with respect to the chemical C. This relative movement achieves the same state as a state where the chemical C flows on the surface of the semiconductor substrate W. Because a flow of the chemical C with respect to the semiconductor substrate W is generated on the entire surface of the semiconductor substrate W, a variation in the flow rate of the chemical C on the surface of the semiconductor substrate W is reduced.

A calculation part 90 calculates the speed and the acceleration that make the flow rate of the chemical C with respect to the surface of the semiconductor substrate W equal to or higher than the predetermined threshold (the first threshold) and that prevent the semiconductor substrate W from floating from the lifter 60.

Other configurations of the third embodiment can be identical to corresponding configurations of the first embodiment. It is not necessary that the gas supply pipes and the chemical supply pipes are provided in the third embodiment. The third embodiment can be combined with the modification of the first embodiment or the second embodiment. Accordingly, the third embodiment can achieve effects identical to those in the first embodiment, the modification, or the second embodiment.

(Speed and Acceleration of Lifter)

Figure 10:
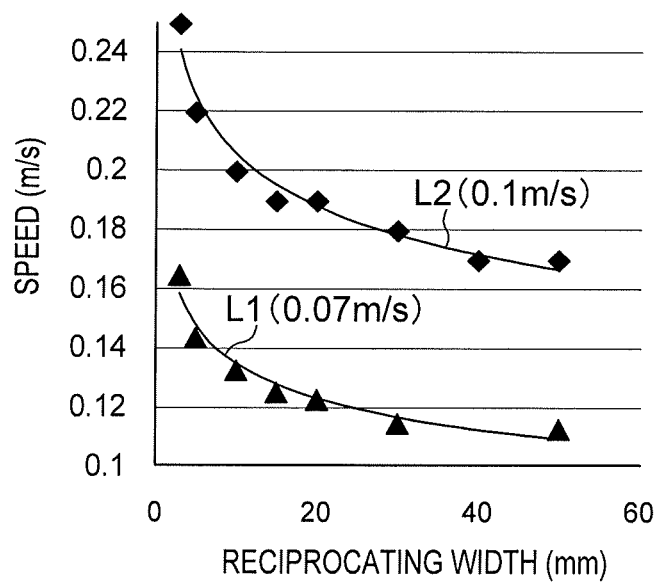
FIG. 10 is a graph illustrating a shaking width and a shaking speed of the lifter.

FIG. 10 is a graph illustrating a shaking width and a shaking speed of the lifter 60. The vertical axis of this graph represents a speed of reciprocation of the lifter 60. The horizontal axis represents a reciprocating width of the lifter 60. The speed is a maximum speed of the lifter 60 when the lifter 60 is caused to reciprocate substantially vertically. The reciprocating width is a moving width (a shaking width) of the reciprocation of the lifter 60.

Further, a line L1 represents a reciprocating width and a speed that are required for achieving a flow rate of the chemical C with respect to the surface of the semiconductor substrate W (a relative flow rate) of 0.07 m/s. A line L2 represents a reciprocating width and a speed that are required for achieving a relative flow rate of the chemical C with respect to the surface of the semiconductor substrate W of 0.1 m/s. Referring to the lines L1 and L2, it is found that when the reciprocating width is made smaller, it is necessary to increase the speed of the lifter 60 in order to maintain the relative flow rate of the chemical C.

It has been already found that the relative flow rate of the chemical C on the surface of the semiconductor substrate W is preferably 0.1 m/s or more in order to suppress precipitation of a by-product. Therefore, the threshold (the first threshold) of the relative flow rate of the chemical C is set to 0.1 m/s, and the line L2 is referred to. Assuming that a reciprocating width, a speed, and an acceleration of the semiconductor substrate W in reciprocation are x, y, and z, respectively, the line L2 is substantially represented as $y=2.8 \times x^{-0.13}$. Therefore, in order to achieve a relative flow rate of the chemical C on the surface of the semiconductor substrate W of 0.1 m/s or more, it is necessary to satisfy Expression 1.

$$y > 2.8 \times x^{-0.13} \quad \text{(Expression 1)}$$

Figure 11:
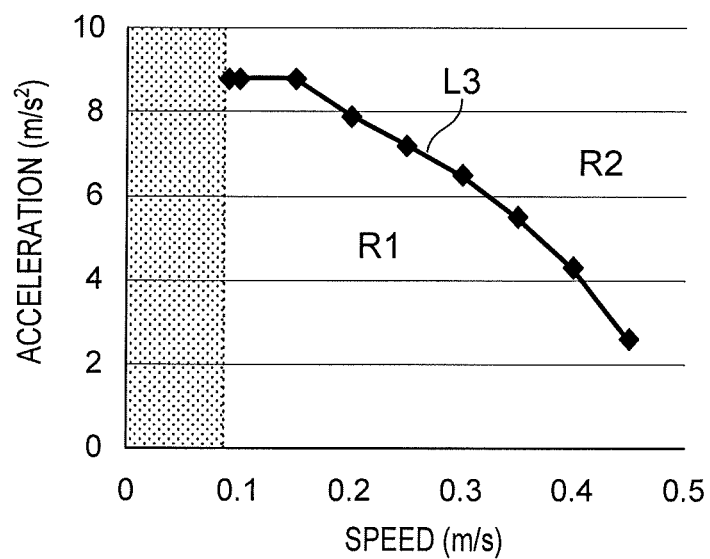
FIG. 11 is a graph illustrating a speed and an acceleration of the lifter.

FIG. 11 is a graph illustrating a speed and an acceleration of the lifter 60. The vertical axis of this graph represents the acceleration of the lifter 60 in reciprocation. The horizontal axis represents the speed of the lifter 60 in the reciprocation. A line L3 represents a boundary of a region R1 in which the semiconductor substrate W does not float from the lifter 60. Therefore, in the region R1 in the graph, the lifter 60 can be caused to reciprocate without causing the semiconductor substrate W to float therefrom. Meanwhile, in a region R2, the semiconductor substrate W floats due to reciprocation. Therefore, the lifter 60 cannot cause the semiconductor substrate W to follow the reciprocation. Further, when floating from the lifter 60, the semiconductor substrate W may fall off from the lifter 60.

Here, the line L3 is substantially represented as $z=-38.8 \times y^2 + 3.9 \times xy + 8.8$. Therefore, the region R1 in the graph has to satisfy Expression 2.

$$z < -38.8 \times y^2 + 3.9 \times xy + 8.8 \quad \text{(Expression 2)}$$

When a reciprocating width x is set, a speed y for achieving a relative flow rate of the chemical C of 0.1 m/s or more is calculated based on Expression 1. Furthermore, an acceleration z that enables reciprocation without causing the semiconductor substrate W to float is calculated by using Expression 2.

The calculation part 90 calculates the speed y and the acceleration z from the reciprocating width x by using Expressions 1 and 2. The reciprocating width x can be input from outside by a user, or can be stored in a memory 91 in advance. For example, in a case where the reciprocating width x is 30 mm, the speed y is calculated by Expression 1 to be about 0.18 m/s or more. Further, the acceleration z is calculated by Expression 2 to be about 8 m/s² or less.

The controller 50 controls the driving part 80 to cause the semiconductor substrate W to reciprocate with the reciprocating width x in accordance with the calculated speed y and the calculated acceleration z. With this operation, the lifter 60 can improve the in-plane uniformity of the flow rate of the chemical C while making the flow rate of the chemical C on the surface of the semiconductor substrate W equal to or higher than 0.1 m/s. As a result, it is possible to improve the in-plane uniformity of the processing for the semiconductor substrate W and to suppress precipitation of a by-product.

The controller 50 can alternately repeat execution of reciprocation of the semiconductor substrate W and stop of the reciprocation. Also in this case, the processing device 1 can improve the in-plane uniformity of the processing for the semiconductor substrate W and suppress precipitation of a by-product to some extent.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor processing device comprising:
    a processing tank configured to store a chemical to allow a semiconductor substrate to be immersed in the chemical;
    a gas supply part provided below the semiconductor substrate accommodated in the processing tank and configured to supply air bubbles to the chemical from below the semiconductor substrate; and
    a first and a second chemical supply parts provided above the gas supply part and below the semiconductor substrate and configured to discharge the chemical into the processing tank in a substantially horizontal direction, towards air bubbles appearing from the gas supply part, wherein the first and second chemical supply parts are arranged on both sides above the gas supply part substantially symmetrically, the first chemical supply part is arranged at a position shifted from immediately above the gas supply part to one side in a substantially horizontal direction, and the second chemical supply part is arranged at a position shifted from immediately above the gas supply part to the other side in a substantially horizontal direction.

2. The device of claim 1, wherein the first and second chemical supply parts alternately discharge the chemical.

* * * * *